(12) United States Patent
Shinozaki

(10) Patent No.: US 6,321,463 B1
(45) Date of Patent: Nov. 27, 2001

(54) SUBSTRATE TREATING APPARATUS AND METHOD OF OPERATING THE SAME

(75) Inventor: Hiroyuki Shinozaki, Kanagawa-ken (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/577,586

(22) Filed: May 25, 2000

(30) Foreign Application Priority Data

May 25, 1999 (JP) .................................................. 11-145167
Aug. 26, 1999 (JP) .................................................. 11-240518

(51) Int. Cl.⁷ .............................. F26B 9/00; F26B 13/00; F26B 13/06
(52) U.S. Cl. .................................. 34/629; 34/638; 34/448
(58) Field of Search ............................ 34/448, 487, 492, 34/548, 565, 566, 84, 632, 638, 629, 412, 58, 317, 475; 134/37, 102.1, 25.4; 427/475; 430/7

(56) References Cited

U.S. PATENT DOCUMENTS

| | | | |
|---|---|---|---|
| 4,735,000 | * | 4/1988 | Hayashi et al. ........................... 34/58 |
| 4,960,658 | * | 10/1990 | Ikeno et al. ................................ 430/7 |
| 5,234,499 | | 8/1993 | Sasaki et al. . |
| 5,347,190 | | 9/1994 | Lewis et al. . |
| 5,548,907 | * | 8/1996 | Gourdine .................................. 34/448 |
| 5,829,156 | * | 11/1998 | Shibasaki et al. ......................... 34/58 |
| 6,012,470 | * | 1/2000 | Jones ................................... 134/25.4 |
| 6,029,369 | * | 2/2000 | Gonzalez-Martin et al. .......... 34/317 |
| 6,035,551 | * | 3/2000 | Schueffer et al. ....................... 34/475 |
| 6,146,469 | * | 11/2000 | Toshima ................................. 134/37 |
| 6,161,311 | * | 12/2000 | Doley et al. ............................ 34/548 |
| 6,170,496 | * | 1/2001 | Chen et al. ......................... 134/102.1 |
| 6,178,660 | * | 1/2001 | Emmi et al. ............................ 34/412 |
| 6,203,859 | * | 3/2001 | Scheuffer et al. .................... 427/475 |
| 6,261,007 | * | 7/2001 | Takamori et al. ................... 396/611 |

FOREIGN PATENT DOCUMENTS

| | | | |
|---|---|---|---|
| 0 655 772 | | 5/1995 | (EP) . |
| 4-287922 | | 10/1992 | (JP) . |
| 11-102882 | | 4/1999 | (JP) . |
| 11-26424 | | 1/2000 | (JP) . |
| 61152021 | * | 7/1986 | (JP) ............................ H01L/21/304 |
| 410622 | * | 1/1992 | (JP) ............................ H01L/21/304 |
| 7245283 | * | 9/1995 | (JP) ............................ H01L/21/304 |
| 97 14178 | | 4/1997 | (WO) . |

* cited by examiner

Primary Examiner—Teresa Walberg
Assistant Examiner—Loenid M Fastovsky
(74) Attorney, Agent, or Firm—Wenderoth, Lind & Ponack, L.L.P

(57) ABSTRACT

A substrate treating apparatus including a substrate support mechanism for supporting a substrate 1 to be treated, a rotary impeller 4 placed to face the surface of the substrate 1 supported by the substrate support mechanism, and at least one nozzle 14 provided in an approximately central portion of the rotary impeller 4, wherein rotating the rotary impeller 4 produces a flow of gas passing through the nozzle 14 and flowing from the central portion of the rotary impeller 4 toward the outer periphery thereof, thereby drying the surface of the substrate supported in a stationary state by the substrate support mechanism.

20 Claims, 12 Drawing Sheets

SUBSTRATE TREATING APPARATUS AND METHOD OF OPERATING THE SAME

BACKGROUND OF THE INVENTION

The present invention relates to a substrate treating apparatus suitable for cleaning and drying substrates having low mechanical strength, e.g. glass substrates and semiconductor wafers, and also relates to a method of operating the substrate treating apparatus.

Drying techniques carried out after the process of cleaning semiconductor wafers, optical discs, etc. can be generally divided into two types as follows. A first type is a technique that employs chemicals, e.g. IPA (isopropyl alcohol). A second type is a technique whereby an object to be dried is rotated at high speed to blow off droplets under centrifugal force. In addition, techniques in which a vacuum technique is combined with the first or second techniques are also employed. However, these techniques suffer from the problems stated below.

The drying method using chemicals, e.g. IPA, incurs a high costs to ensure safety as combustible chemicals are employed. Moreover, this method is liable to cause environmental pollution.

In the drying method using high-speed rotation, because an object to be dried is rotated at high speed, a centrifugal force acts on the object, and torsional stress also acts thereon during acceleration or deceleration of the rotation, causing the base material of the object to be damaged. This causes a reduction in yield. In addition, during the drying process, the base material of a substrate to be treated elutes out into contact areas between the substrate and waterdrops to form annular protuberance-shaped traces, i.e. water marks.

Figure 1:
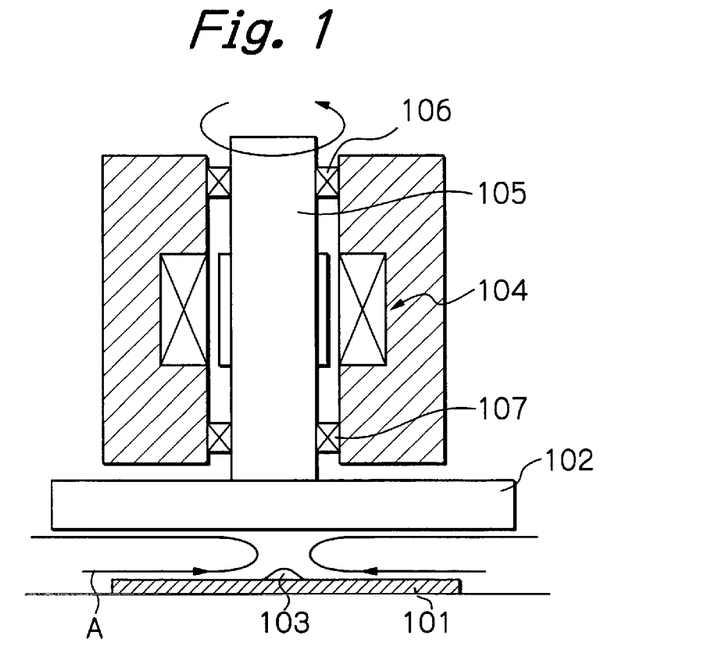
FIG. 1 is a diagram showing a structural example of a conventional substrate treating apparatus.

It has been proposed to dry a substrate by using an apparatus shown in FIG. 1. A substrate 101 to be treated (i.e. an object to be dried) is placed in a stationary state, a rotary impeller 102 is installed to face a surface of the substrate 101 and the surface of the substrate 101 is dried by rotation of the rotary impeller 102. However, this proposal has not yet been put to practical use for the following reason. That is, an outward air flow occurring on the surface of the impeller 102 produces a negative pressure at the central portion of the rotary impeller 102. Consequently, a secondary flow occurs on the surface of the substrate 101 as shown by the arrow A. As a result, a waterdrop 103 is likely to remain in the center of the surface of the substrate 101.

In addition, a rotating shaft 105 of a motor 104 for rotating the rotary impeller 102 is supported by rolling bearings 106 and 107. Therefore, if lubrication is effected with a grease which is usable in a clean environment, the upper limit value for the DN value [bearing diameter (mm)×rotational speed (rpm)] is low, so that it is difficult to employ a rotating shaft 105 in the form of a hollow shaft.

SUMMARY OF THE INVENTION

In view of the above-described circumstances, an object of the present invention is to provide a substrate treating apparatus which is capable of rapidly cleaning and drying a surface of a substrate to be treated without damaging the base material of the substrate and without forming any water mark on the surface of the substrate, and which does not generate particles or the like and is therefore capable of maintaining clean conditions, and also to provide a method of operating the substrate treating apparatus.

To solve the above-described problems, according to a first aspect of the invention, a substrate treating apparatus is provided which includes a substrate support mechanism for supporting a substrate to be treated, and a rotary impeller placed to face a surface of the substrate supported by the substrate support mechanism. At least one nozzle is provided in an approximately central portion of the rotary impeller. Rotating the rotary impeller produces a flow of gas passing through the nozzle and flowing from the central portion of the impeller toward the outer periphery thereof, thereby drying the surface of the substrate supported in a stationary state by the substrate support mechanism.

As stated above, rotating the rotary impeller causes a gas flow expelled through the nozzle provided in the central portion of the rotary impeller to form a flow along the surface of a substrate which is supported in a stationary state by the substrate support mechanism. Thus, the gas flows toward the outer periphery of the substrate, enabling the substrate surface to be dried efficiently. Moreover, the rotation of the rotary impeller causes the gas to flow into the gap between the rotary impeller and the substrate through the nozzle. Therefore, no negative pressure is produced at the central portion of the impeller. Accordingly, no waterdrops remain on the central portion of the surface of the substrate, and the substrate surface can be dried rapidly. In addition, since the substrate is held stationary, no stress acts thereon.

According to a second aspect of the invention, in the substrate treating apparatus according to the first aspect, the rotary impeller is secured to a hollow rotating shaft. The hollow section of the rotating shaft communicates with the nozzle. The hollow section is provided with either or both of a pure water supply port for supplying pure water and a clean gas supply port for supplying a clean gas.

Because either or both of a pure water supply port and a clean gas supply port are provided in the hollow section of the rotating shaft, as stated above, pure water and/or a clean gas can be supplied to the central portion of the substrate through the nozzle. This arrangement is suitable for cleaning and drying a substrate as will be described later in detail.

According to a third aspect of the invention, in the substrate treating apparatus according to the first or second aspect, the rotary impeller is connected to a rotating shaft of a driving motor. The rotating shaft of the driving motor is supported by a magnetic bearing.

Because the rotating shaft of the driving motor is supported by magnetic levitation manner by a magnetic bearing, as stated above, there is no likelihood of particles being generated. Thus, the apparatus can be used in a clean environment.

According to a fourth aspect of the invention, in the substrate treating apparatus according to any one of the first to third aspects, a surface of the rotary impeller that faces the substrate is a flat surface.

If the surface of the rotary impeller that faces the substrate is flat, as stated above, although the blade efficiency is reduced to a some extent, the surface of the rotary impeller that faces the substrate can be brought as close to the substrate as possible, and an outward gas flow can be produced at a position extremely close to the surface of the substrate. Therefore, the substrate surface can be dried efficiently.

According to a fifth aspect of the invention, in the substrate treating apparatus according to any one of the first to fourth aspects, the rotary impeller has a flat surface extending from the center thereof to a position slightly outside the outer periphery of the substrate and further has a blade structure outside the flat surface.

If the rotary impeller has a flat surface extending from the center thereof to a position slightly outside the outer periphery of the substrate and further has a blade structure outside the flat surface, as stated above, the flat surface can be placed in close proximity to the substrate. The gas from the nozzle in the central portion of the impeller flows from the central portion toward the outer periphery close to the surface of the substrate in such a manner as to be sucked into the blade structure outside the flat surface. Accordingly, the substrate can be dried more efficiently by the increased gas flow.

According to a sixth aspect of the invention, a method of operating a substrate treating apparatus is provided, wherein the substrate treating apparatus includes a substrate support mechanism for supporting a substrate to be treated, and a rotary impeller secured to a hollow rotating shaft and positioned so as to face a surface of the substrate supported by the substrate support mechanism. At least one nozzle is provided in an approximately central portion of the rotary impeller so as to communicate with the hollow section of the rotating shaft. A pure water supply port for supplying pure water and a clean gas supply port for supplying a clean gas are provided in the hollow section of the rotating shaft. The method of operating the substrate treating apparatus includes the step of filling pure water into the gap between the rotary impeller and the substrate to form a pure water layer, and continuously supplying pure water from the pure water supply port through the nozzle to form a flow of pure water on the substrate that flows from the center of the substrate toward the outer periphery thereof. The method further includes the step of rotating the rotary impeller at a predetermined rotational speed to scatter pure water of the pure water layer outwardly, and continuously supplying pure water to the central portion of the substrate through the nozzle. Further, the method includes the step of rotating the rotary impeller at a rotational speed higher than the predetermined rotational speed, and supplying the clean gas from the clean gas supply port through the nozzle while stopping the supply of the pure water.

As stated above, after a pure water layer has been formed between the rotary impeller and the substrate, the rotary impeller is rotated. Consequently, pure water is scattered outwardly. However, because pure water is continuously supplied through the nozzle, clean pure water is successively supplied to the substrate surface. Accordingly, the concentration in pure water of a substance eluting or solving out from the substrate into the pure water is extremely low. In addition, the rotary impeller is rotated at high speed, and a clean gas is supplied, and at the same time, the supply of pure water is stopped. Consequently, the pure water layer on the substrate surface can be blown off rapidly. As a result, the substrate surface dries rapidly, and the concentration in pure water of a substance eluting out from the substrate is extremely low. Therefore, no water marks appear.

The above and other objects, features and advantages of the present invention will become more apparent from the following description when taken in conjunction with the accompanying drawings in which preferred embodiments of the present invention are shown by way of illustrative examples.

BRIEF DESCRIPTION OF THE DRAWINGS

FIG. 2 is a diagram showing an original shape of a substrate treating apparatus according to the present invention, in which: part (a) of FIG. 2 is a sectional view of the apparatus: part (b) is a sectional view taken along line B—B in part (a): and part (c) is a view similar to part (b), but showing a preferred shape of the rotary impeller, FIG. 4 is a diagram showing a structural example of a rotary impeller in the substrate treating apparatus according to the present invention, in which: part (a) of FIG. 4 is a sectional view; and part (b) of FIG. 4 is a view of the rotary impeller as seen from the substrate side, FIG. 5 is a diagram showing another structural example of a rotary impeller in the substrate treating apparatus according to the present invention, in which: part (a) of FIG. 5 is a sectional view; and part (b) of FIG. 5 is a view of the rotary impeller as seen from the substrate side, FIG. 6 is a diagram showing a further structural example of a rotary impeller in the substrate treating apparatus according to the present invention, in which: part (a) of FIG. 6 is a sectional view; and part (b) of FIG. 6 is a view of the rotary impeller as seen from the upper side thereof, FIG. 7 is a diagram showing a still further structural example of a rotary impeller in the substrate treating apparatus according to the present invention, in which: part (a) of FIG. 7 is a sectional view; part (b) of FIG. 7 is a bottom view; and part (c) of FIG. 7 is a fragmentary side view, FIG. 8 is a diagram showing a yet further structural example of a rotary impeller in the substrate treating apparatus according to the present invention, in which: part (a) of FIG. 8 is a sectional view; part (b) of FIG. 8 is a bottom view; and part (c) of FIG. 8 is a fragmentary side view.

DETAILED DESCRIPTION OF THE INVENTION

Preferred embodiments of the present invention will be described below with reference to the accompanying drawings.

To solve the aforementioned problems, in the conventional substrate treating apparatus, the inventor first conceived an arrangement as shown in FIG. 2. A radial blade type rotary impeller 102 is provided with a nozzle 108 in the center thereof, and the central portion of the rotating shaft 105 is formed into a hollow 105a. As the rotary impeller 102 is rotated, a gas supplied into the hollow 105a flows through the nozzle 108 to cancel a negative pressure arising at the central portion of the rotary impeller 102. However, this arrangement is not satisfactory for carrying out drying to remove droplets from the substrate 101 which is placed in a stationary state.

Figures 2A, 2B, 2C:
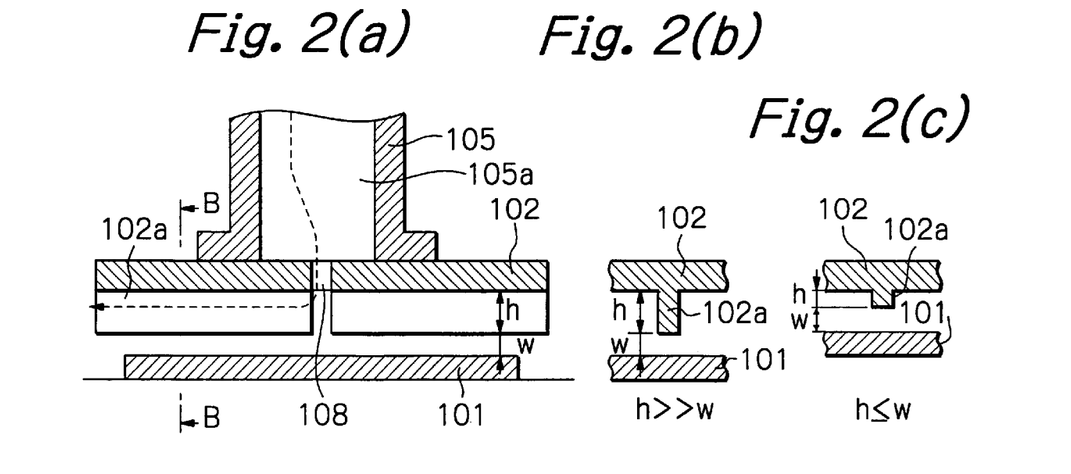

The reason for this is as follows. In general, it is known to be desirable to increase the height h of blades 102a in order to increase a gas flow rate. However, if a blade height h is set to be greater than a certain value, that is, if the height h of the blades 102a is set to be greater than the gap w between the distal ends of the blades 102a and the surface of the substrate 101, the space between the substrate 101 and the rotary impeller 102 becomes excessively wide as shown in FIGS. 2(a) and 2(b). As a result, a boundary layer flow or fastest flow occurring at the surface of the rotary impeller 102 is undesirably away from the substrate 101.

In addition, an inward flow or gas flow toward the center of the rotating shaft 105 is undesirably produced on the surface of the substrate 101 on the stationary side and, thus, droplets remain on the central portion of the substrate 101. The reason for the occurrence of the inward flow toward the center of the rotating shaft 105 is explained as follows. The inward flow occurs at the central portion of the substrate as a replenishing flow corresponding to the increased outward gas flow. Replenishment is partially effected by provision of a gas through the nozzle 108. However, in view of the flow resistance to replenishment, a larger flow path sectional area exists on the side of the surface of the substrate 101. Therefore, an inward flow (secondary flow) is likely to occur on the surface of the substrate 101.

Accordingly, as shown in FIG. 2(c), a structure in which how is favorable even in the case of using the radial blade type rotary impeller 102 shown in FIG. 2. Excessively increasing the height h of the blades 102a, which face the surface of the substrate 101, will result in an adverse effect.

Figure 3:
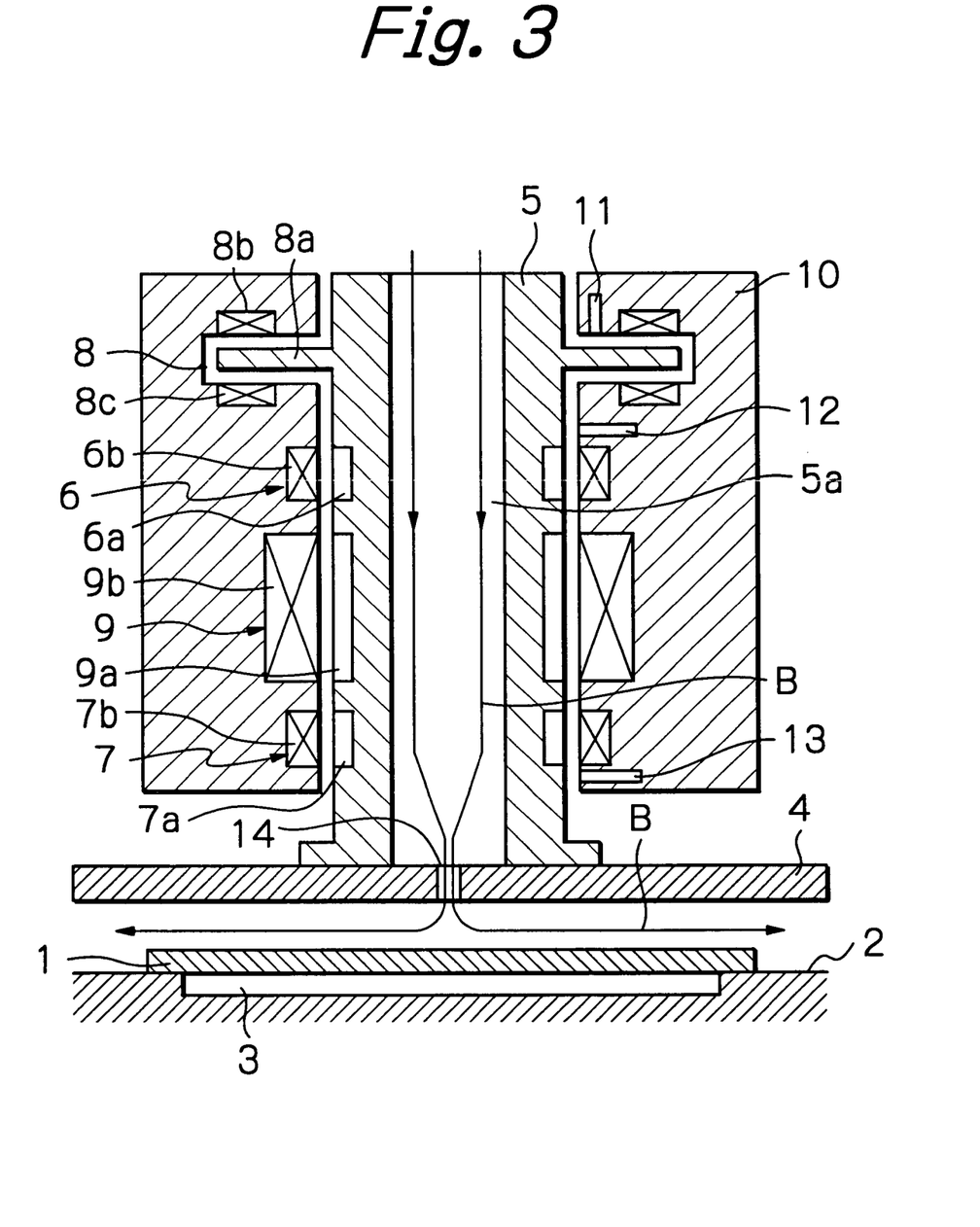
FIG. 3 is a diagram schematically showing an example of the structure of the substrate treating apparatus according to the present invention.

FIG. 3 is a diagram schematically showing the structural example of the substrate treating apparatus according to the present invention. In the figure, a substrate 1 to be treated, e.g. a glass substrate, is held by a chuck mechanism 3, e.g. a vacuum chuck mechanism, provided on a slide table 2. A rotary impeller 4 is placed to face the upper surface (surface to be treated) of the substrate 1. The rotary impeller 4 is secured to the lower end of a rotating shaft 5. As the slide table 2, a table that performs an eccentric rotation or a slide motion during a treatment may also be selected appropriately according to circumstances.

The rotating shaft 5 is supported by magnetic levitation manner by two (upper and lower) radial magnetic bearings 6 and 7 and an axial magnetic bearing 8. A driving motor 9 drives the rotary impeller 4 to rotate. The rotating shaft 5 extends through the center of a fixed stator 10. Bearing targets 6a and 7a of the radial magnetic bearings 6 and 7 are secured to the outer periphery of the rotating shaft 5. A motor rotor 9a of the driving motor 9 is also secured to the outer periphery of the rotating shaft 5. Further, a bearing target 8a of the axial magnetic bearing 8 is secured to the outer periphery of the rotating shaft 5.

Electromagnets 6b and 7b of the radial magnetic bearings 6 and 7 are secured to portions of the surface of the stator 10 that face the bearing targets 6a and 7a, respectively. A motor stator 9b is secured to a portion of the surface of the stator 10 that faces the motor rotor 9a. Further, a pair (upper and lower) of electromagnets 8b and 8c of the axial magnetic bearing 8 are secured to respective portions of the surface of the stator 10 that face the bearing target 8a. Axial displacement of the rotating shaft 5 is detected with an axial displacement sensor 11. A radial displacement of the rotating shaft 5 is detected with radial displacement sensors 12 and 13 provided in upper and lower portions, respectively, of the stator 10.

The output of each of the above-described displacement sensors is input to a control circuit (not shown). The control circuit controls electric currents supplied to the electromagnets 6b and 7b of the radial magnetic bearings 6 and 7 and to the electromagnets 8b and 8c of the axial magnetic bearing 8 to levitate the rotating shaft 5 to a predetermined position.

The hollow 5a of the rotating shaft 5 is in the form of a pipe. The rotary impeller 4 has a nozzle 14 provided in the center thereof. Although one nozzle 14 is shown in the figure, the number of nozzles is not necessarily limited to one. The rotary impeller 4 may be provided with a plurality of nozzles, i.e. at least one nozzle. The diameter of the nozzle 14 is set appropriately. The nozzle 14 communicates with the hollow section 5a of the rotating shaft 5. As the rotary impeller 4 is rotated, a gas (e.g. dry air) supplied into the hollow section 5a forms a gas flow passing through the nozzle 14 and flowing from the central portion of the rotary impeller 4 toward the outer periphery of the rotary impeller 4 along the surface of the substrate 1 as shown by the arrow B. It should be noted that in this embodiment the lower surface of the rotary impeller 4 (i.e. the impeller surface facing the substrate 1) is a flat surface. Even if the lower surface of the rotary impeller 4 is flat, the rotation of the impeller 4 can create an outward gas flow B.

Figure 4A:
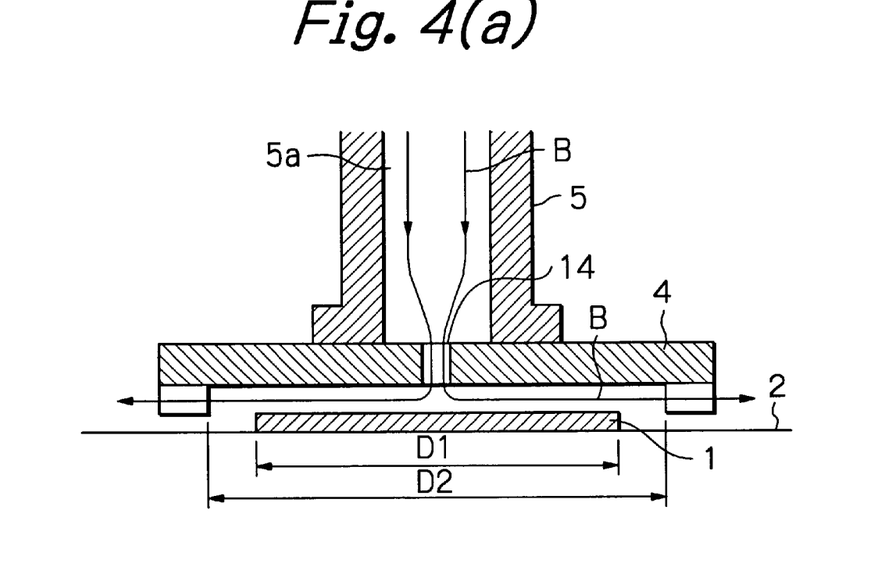
Figure 4B:
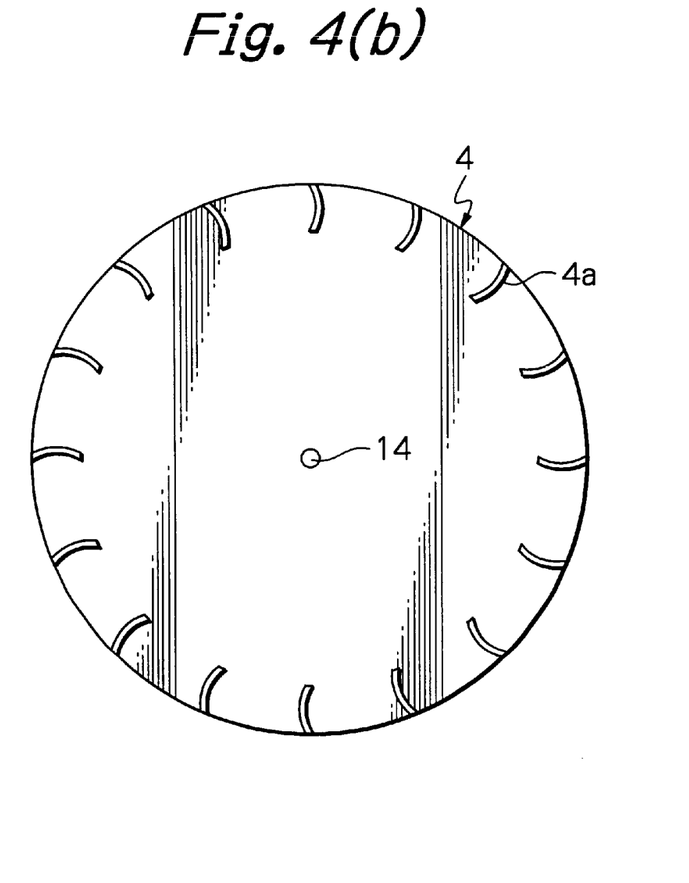

FIG. 4 is a diagram showing a preferred structural example of the rotary impeller 4. Part (a) of FIG. 4 is a sectional view, and part (b) of FIG. 4 is a view of the rotary impeller 4 as seen from the substrate side. The rotary impeller 4 has a plurality of blades 4a provided on the outer peripheral portion thereof at predetermined regular intervals. The portion of the rotary impeller 4 inside the blades 4a forms a flat disk-shaped configuration. The relationship between the substrate 1 and the rotary impeller 4 is set so as to satisfy the condition of D1<D2, where D1 is the outer diameter of the substrate 1, and D2 is the inner diameter of the rotary impeller 4, that is, the diameter of a circle defined by the inner ends of the blades 4a. As the rotary impeller 4 with the described structure is rotated, the gas supplied into the hollow section 5a of the rotating shaft 5 flows as shown by the arrow B. That is, the gas passes through the nozzle 14 provided in the center and flows toward the outer periphery between the rotary impeller 4 and the substrate 1 in such a manner as to be sucked by the rotating blades 4a. Thus, the gas dries the surface of the substrate 1 more efficiently without producing a negative pressure at the central portion of the rotary impeller 4.

The rotating shaft 5 may be supported with rolling bearings. However, the use of the hollow rotating shaft 5 results in an increase in diameter of the bearing portions. Consequently, problems are likely to occur such as a reduction in working life and contamination of the substrate 1 with lubricant. Therefore, magnetic bearings are more suitable for use.

Use of magnetic bearing are also preferable from the view point of DN value. For example, in a case where the diameter of the rotating shaft 5 is about 100 millimeters when the outer diameter of the substrate 1 is 300 millimeters and the diameter of the rotary impeller 4 is 300 millimeters plus alpha, that is, in a case where the diameter of the rotating shaft 5 is one third of the latter diameter, the DN value is 1,200,000 when the rotational speed is 12,000 rpm. However, even in the case of a rolling bearing having a lubricating mechanism for a high-performance gas turbine, the DN value limit is 1,000,000. Accordingly, magnetic bearings are more suitable for use in the present invention.

Figure 5A:
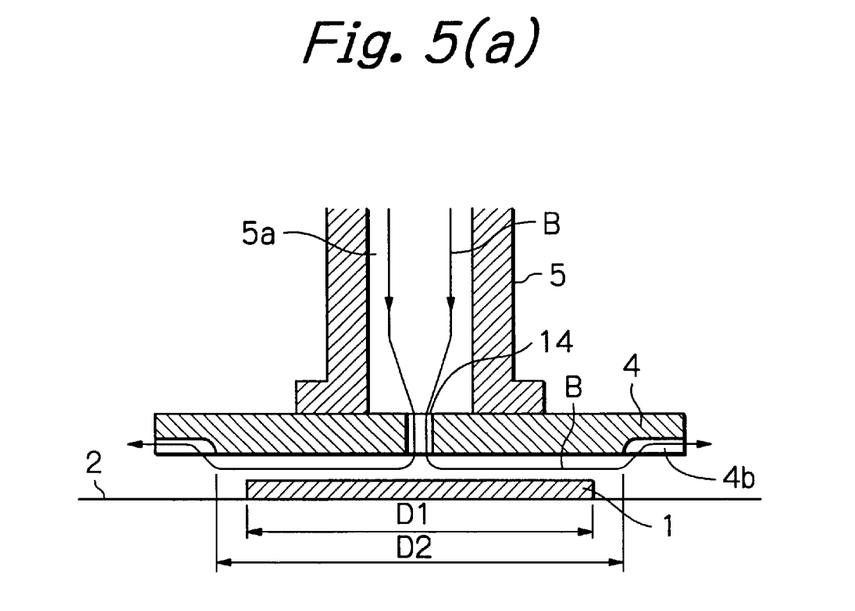
Figure 5B:
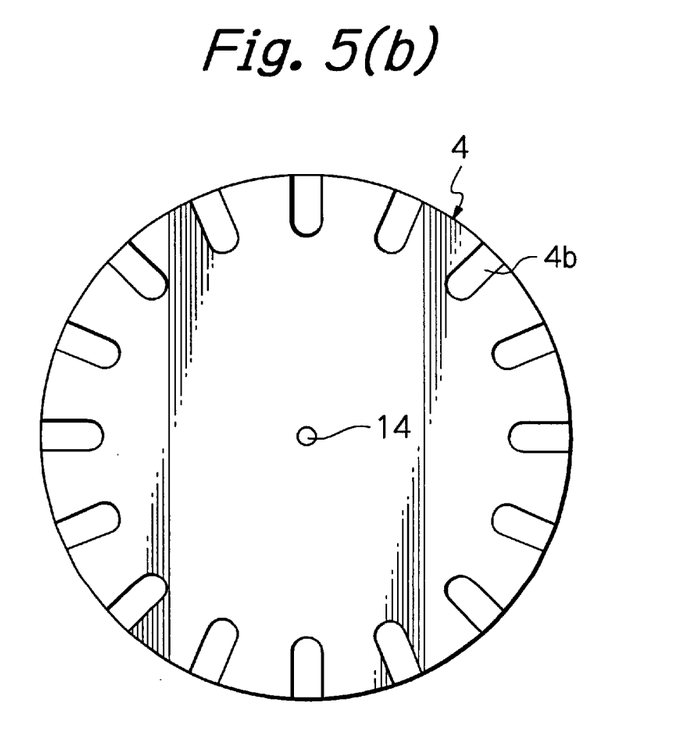

FIG. 5 is a diagram showing another structural example of the rotary impeller 4. Part (a) of FIG. 5 is a sectional view, and part (b) of FIG. 5 is a view of the rotary impeller 4 as seen from the substrate side. The rotary impeller 4 has a plurality of blade grooves 4b provided on the outer peripheral portion of the bottom surface thereof at predetermined regular intervals. The relationship between the substrate 1 and the rotary impeller 4 is set so as to satisfy the condition of D1<D2, where D1 is the outer diameter of the substrate 1, and D2 is the inner diameter of the rotary impeller 4, that is, the diameter of a circle defined by the inner ends of the blade grooves 4b. As the rotary impeller 4 with the described structure is rotated, the gas supplied into the hollow section 5a of the rotating shaft 5 flows as shown by the arrow B. That is, the gas passes through the nozzle 14 provided in the center and flows toward the outer periphery along the surface of the substrate 1 in such a manner as to be sucked into the rotating blade grooves 4b. Therefore, the gas flows close to the surface of the substrate 1 without producing a negative pressure at the central portion of the rotary impeller 4. Thus, the surface of the substrate 1 is dried efficiently.

Figure 6A:
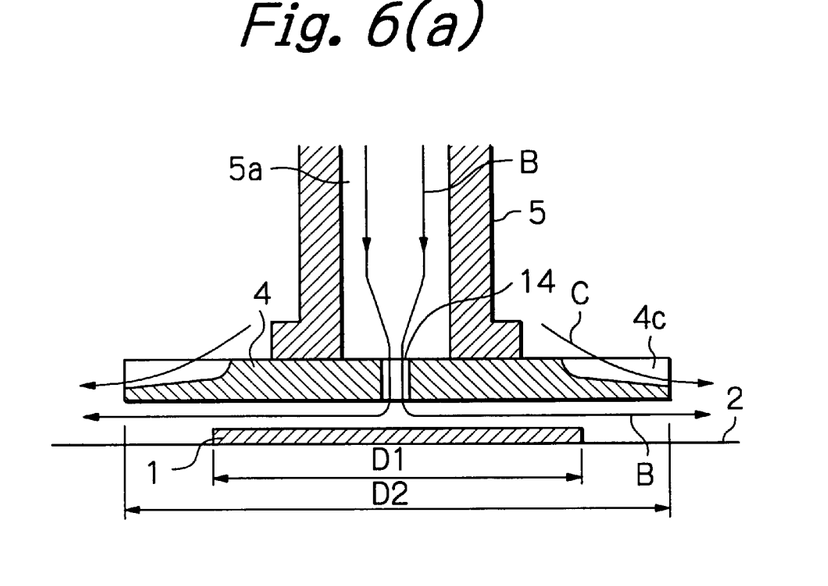
Figure 6B:
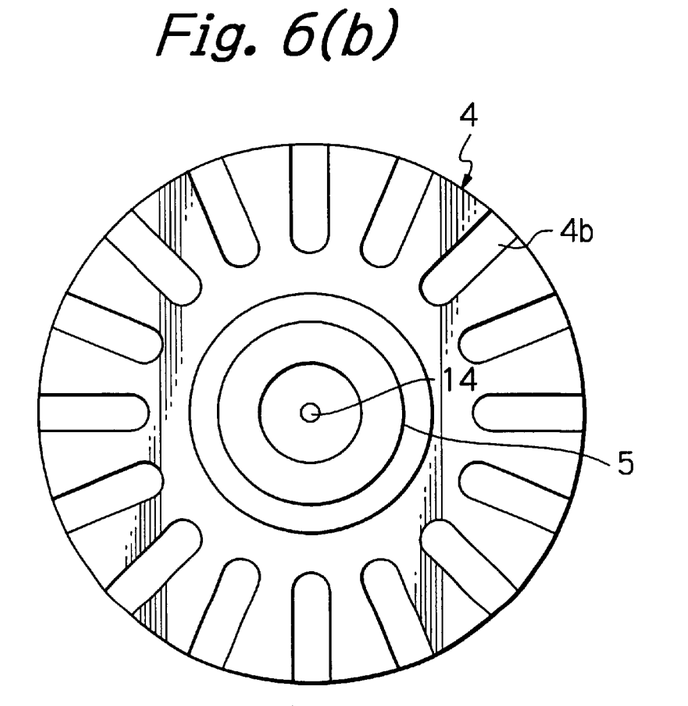

FIG. 6 is a diagram showing another structural example of the rotary impeller 4. Part (a) of FIG. 6 is a sectional view, and part (b) of FIG. 6 is a view of the rotary impeller 4 as seen from the upper side thereof. The rotary impeller 4 has a plurality of grooves 4c provided on the outer peripheral portion of the top surface thereof at predetermined regular intervals. As the rotary impeller 4 is rotated, a gas flow as shown by the arrow C is produced by the grooves 4c on the top surface of the rotary impeller 4. That is, the gas flows from the neighborhood of the rotating shaft 5 toward the outer periphery of the rotary impeller 4 along the top surface thereof. In addition, the rotation of the rotary impeller 4 causes the gas supplied into the hollow section 5a of the rotating shaft 5 to flow as shown by the arrow B. That is, the gas passes through the nozzle 14 provided in the center of the rotary impeller 4 and flows toward the outer periphery along the bottom surface of the rotary impeller 4. The gas flow shown by the arrow C acts so as to aid the gas flow along the bottom surface of the rotary impeller 4, which is shown by the arrow B. Therefore, the surface of the substrate 1 is dried efficiently by the gas flow shown by the arrow B.

Figure 7A:
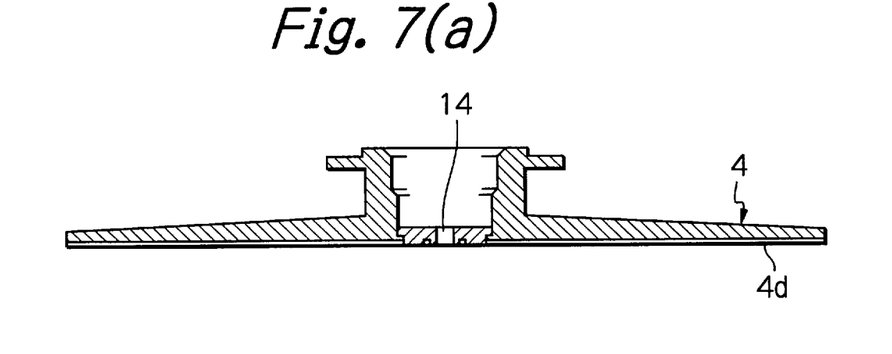
Figures 7B, 7C:
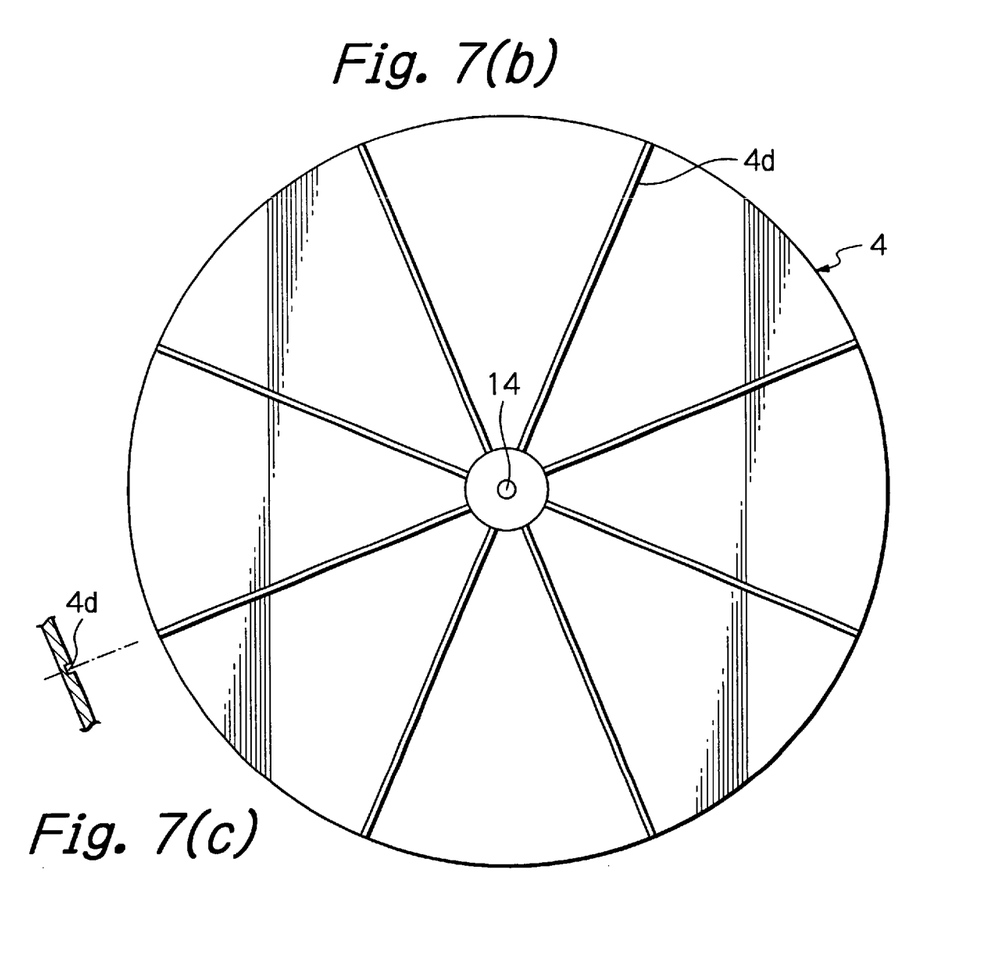
Figure 8A:
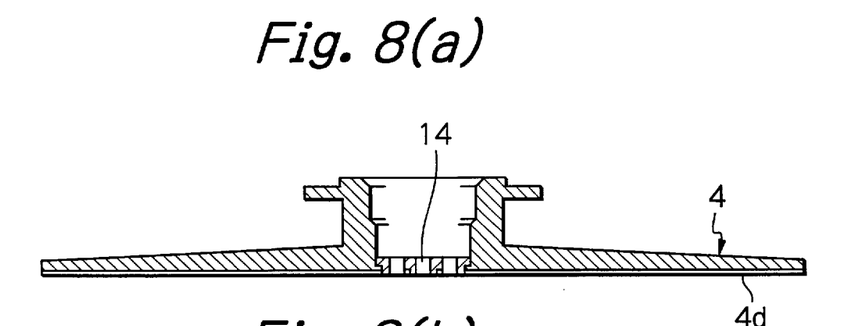
Figures 8B, 8C:
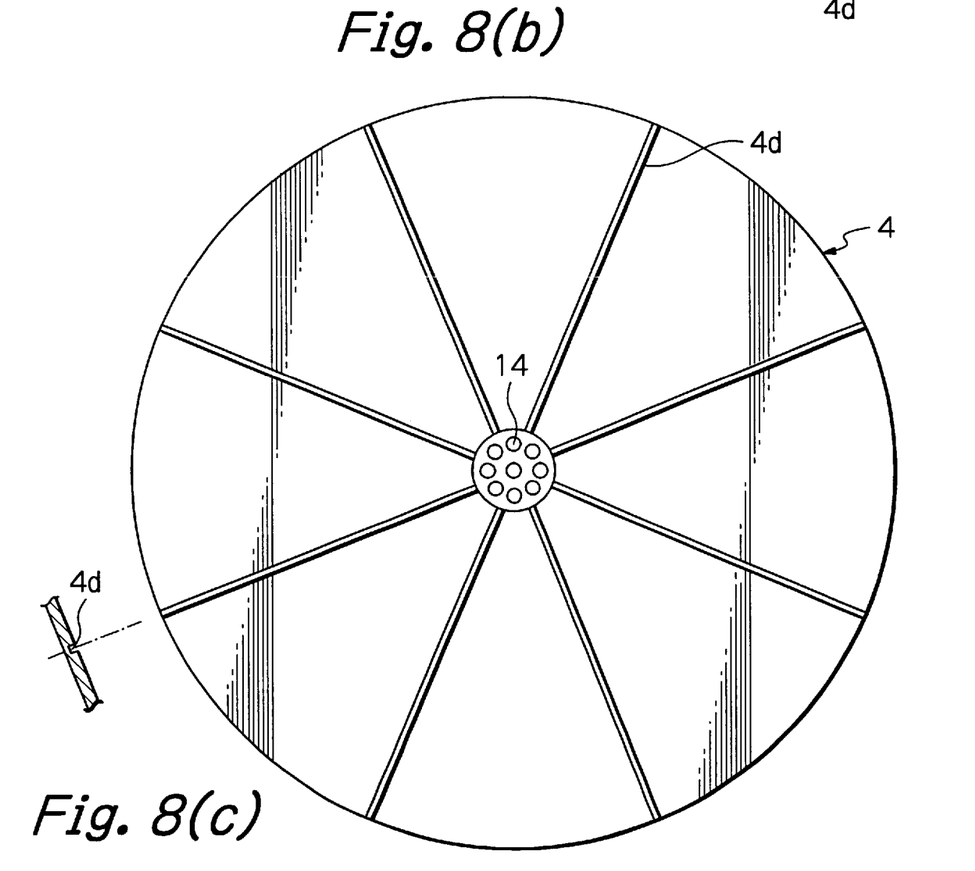

The configuration of the rotary impeller 4 is not necessarily limited to the above examples. As shown in FIG. 7, for example, the bottom surface of the rotary impeller 4 may be formed to have radial U-grooves 4d. Part (a) of FIG. 7 is a sectional view, and part (b) of FIG. 7 is a bottom view. Part (c) of FIG. 7 is a fragmentary side view. In this case also, the number of nozzles 14 is not necessarily limited to one. As shown in FIG. 8, for example, the rotary impeller 4 may be provided with a plurality of nozzles 14 (9 nozzles 14 in the illustrated example). It should be noted that part (a) of FIG. 8 is a sectional view, and part (b) of FIG. 8 is a bottom view, and part (c) of FIG. 8 is a fragmentary side view.

Figure 9:
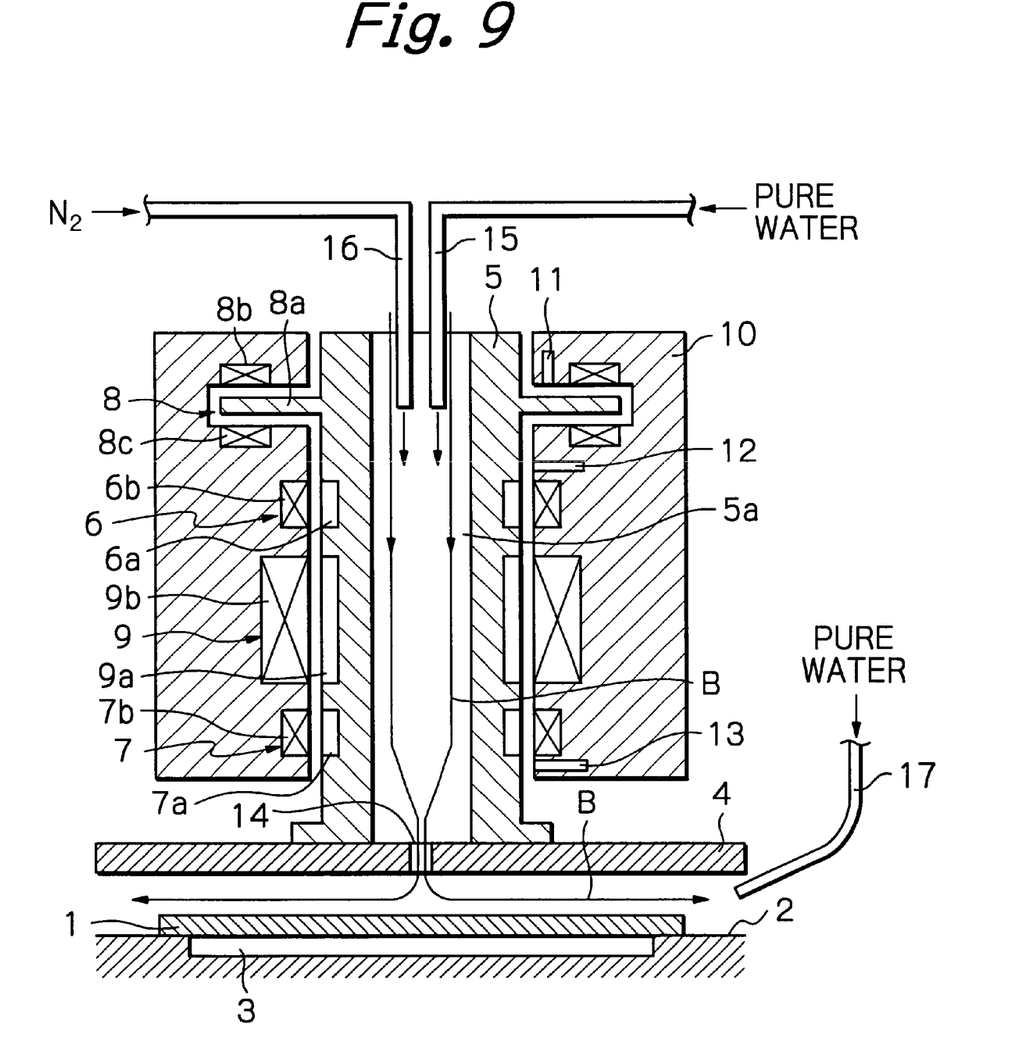
FIG. 9 is a diagram showing another example of the structure of the substrate treating apparatus according to the present invention.

FIG. 9 is a diagram showing another example of the structure of the substrate treating apparatus according to the present invention. This substrate treating apparatus differs from the substrate treating apparatus arranged as shown in FIG. 3 in that a pure water supply port 15 for supplying pure water and a clean gas supply port 16 for supplying a clean gas, e.g. $N_2$ gas, are provided in the hollow section 5a of the rotating shaft 5, and the substrate treating apparatus is further provided with a pure water supply nozzle 17 for filling pure water into the gap between the rotary impeller 4 and the substrate 1.

Next, the method of operating the substrate treating apparatus arranged as stated above will be described. After the substrate 1 to be treated has been held on the slide table 2 by the chuck mechanism 3, the substrate 1 is placed directly under the rotary impeller 4. In this state, pure water is supplied from either or both of the pure water supply port 15 and the pure water supply nozzle 17 to fill the gap between the substrate 1 and the rotary impeller 4 with pure water. Consequently, a pure water layer is formed in the gap by surface tension.

Then pure water is continuously supplied from the pure water supply port 15 to continue the supply of pure water to the gap between the substrate 1 and the rotary impeller 4 through the nozzle 14. Thus, a flow of pure water is formed on the surface of the substrate 1 such that the pure water flows from the center toward the outer periphery. In this state, rotation of the rotary impeller 4 is started. The rotation of the rotary impeller 4 causes the pure water between the substrate 1 and the rotary impeller 4 to flow outward. Therefore, pure water is further supplied from the pure water supply port 15 to replenish the pure water between the substrate 1 and the rotary impeller 4. Thus, clean pure water is successively supplied to the surface of the substrate 1. As a result, the concentration in pure water of a substance (e.g. Si when the substrate 1 to be treated is a silicon wafer) eluting out from the surface of the substrate 1 into the pure water is kept at an extremely low level at all times.

During operation at a certain rotational speed (e.g. 30 to 3,000 rpm) or at a considerably high rotational speed (e.g. 10,000 rpm), supply of clean gas from the clean gas supply port 16 is started, and supply of pure water from the pure water supply port 15 is stopped. If the above-described control is effected during operation of the rotary impeller 4 at a somewhat low rotational speed, the rotational speed of the rotary impeller 4 is increased at approximately the same time as the supply of pure water is switched to the supply of clean gas. The rotational speed of the rotary impeller 4 at which the supply of pure water is switched to the supply of clean gas may be selected in view of the problem of pure water consumption, the process effect, etc. However, it is essential to switch from a supply of pure water to a supply of clean gas only after the flow of pure water between the rotary impeller 4 and the substrate 1 has been enhanced sufficiently by the rotation of the rotary impeller 4.

When clean gas reaches the surface of the substrate 1, pure water on the surface of the substrate 1 has reached a sufficiently high flow velocity (i.e. a sufficiently high rotational speed). Therefore, the pure water layer can be blown off rapidly. As a result, the surface of the substrate 1 dries rapidly. In addition, the concentration of a substance eluting out from the substrate 1 in pure water is extremely low. Therefore, no annular protuberance-shaped traces (water marks) are left in portions where waterdrops contact the substrate 1 during the drying process.

By performing the above-described operation with the substrate treating apparatus shown in FIG. 9, cleaning (rinsing) and drying treatment free from water marks can be carried out without rotating the substrate 1. In other words, it is possible to perform a cleaning and drying treatment, without any deleterious effect on the substrate 1. In addition, the apparatus does not need to have an explosion-proof structure as no combustible chemicals, e.g. isopropyl alcohol, are used in the drying process. Moreover, the above-described operating method requires minimal motor output because the rotary impeller is not rapidly accelerated from a stationary state. Accordingly, the substrate treating apparatus can be made compact in size, and a reduction in costs can be realized.

A problem to be solved at present in the substrate rotating type cleaning and drying apparatus is how to eliminate water marks of several microns and several 1/10microns in diameter. Let us estimate the next-generation specifications of the substrate rotating type cleaning and drying apparatus which might solve the above problem by statistically analyzing forces acting on waterdrops by rotation of a substrate and adhesive force of waterdrops in terms of the waterdrop diameter based on certain assumptions. Then, let us pick up other problems associated with the substrate rotating type cleaning and drying apparatus and show that the substrate treating (cleaning and drying) apparatus according to the present invention, in which the substrate is held stationary, is superior.

The substrate rotating type system, in which the substrate is subjected to cleaning and drying treatment while being rotated, operates on the principle that waterdrops are blown off by centrifugal force acting on the waterdrops. Waterdrops adhering to the central portion of the substrate are moved to a certain radial position under the fluid force of a gas flow produced in parallel to the substrate by rotation of the substrate. Then, the waterdrops are blown off by a centrifugal force. At this time, it is necessary to control the gas flow in order to prevent waterdrops and particles from being readhering to the substrate under the gas flow. Thus, a gas flow control method can be utilized in which a dry nitrogen gas supply and evacuation are used jointly.

Figure 10:
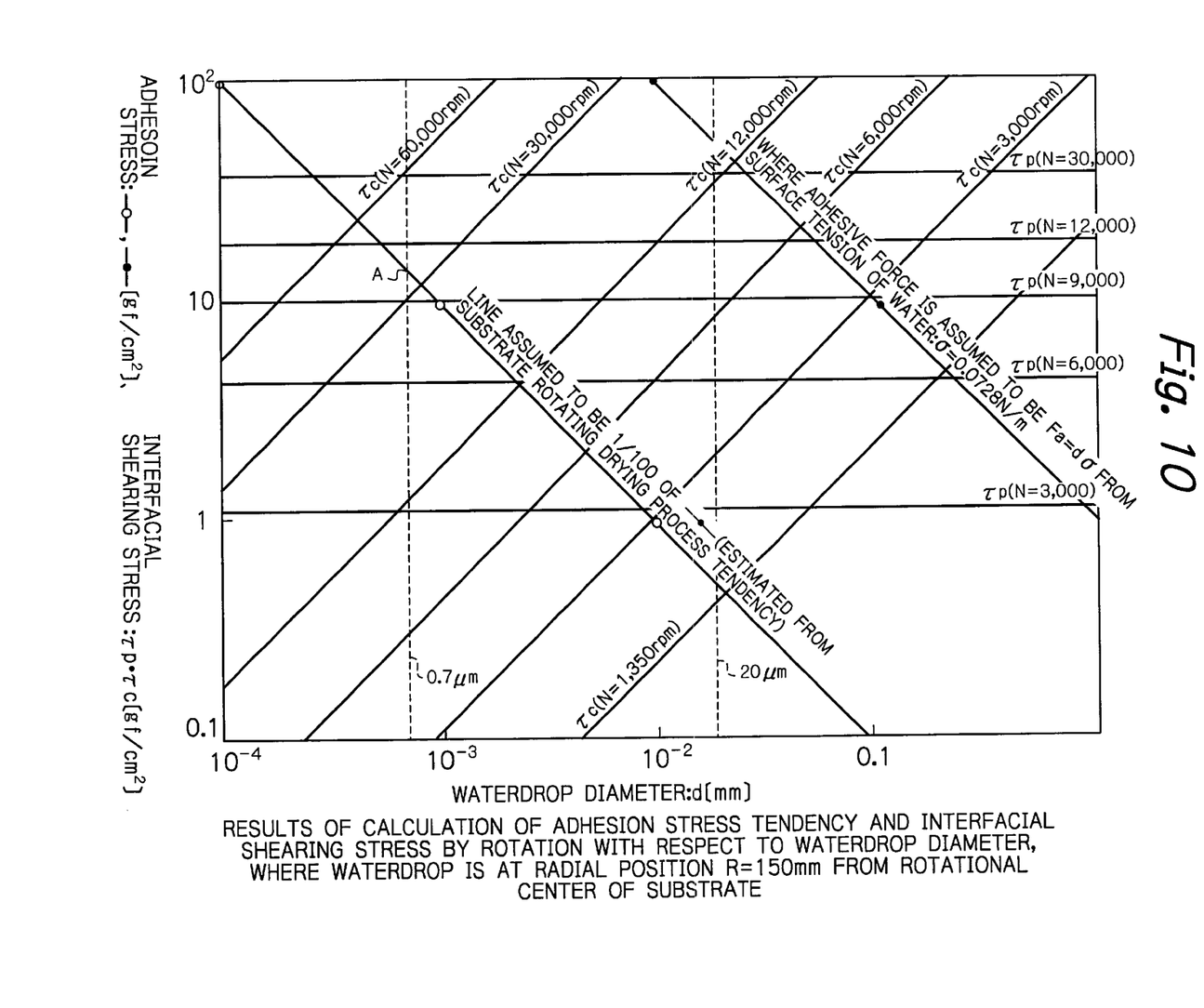
FIG. 10 is a graph showing the results of calculation of the adhesion stress tendency and interfacial shearing stress by rotation with respect to the waterdrop diameter.

FIG. 10 is a graph showing the results of calculation of the adhesion stress tendency and interfacial shearing stress by rotation with respect to a waterdrop diameter. The calculation was conducted on a waterdrop at a radial position r=150 mm from a rotational center of a substrate. In FIG. 10, the ordinate axis represents the interfacial shearing stress (obtained by dividing each calculated force by the area of a base of a hemispherical waterdrop), and the abscissa axis represents the waterdrop diameter. Forces acting on waterdrops upon rotation comprize a centrifugal force and fluid force. In FIG. 10, $\tau p$ denotes interfacial shearing stress by fluid force ($\tau p = Fp/S$, where Fp is a fluid force, and S is the waterdrop adhesion area), and $\tau c$ denotes interfacial shearing stress under a centrifugal force ($\tau c = Fc/S$, where Fc is a centrifugal force). It is assumed herein that the waterdrops are hemispherical.

Statistical analysis of the measurement results obtained by experimentation shows that there are two kinds of problematic groups of water marks to be eliminated. The first group consists of water marks having a diameter of around about 20 microns. The second group consists of water marks having a diameter of around about 0.7 microns. The interfacial shearing stress $\tau p$ under fluid force remains constant independent of the waterdrop diameter. The adhesion stress increases as the waterdrop diameter becomes smaller. Regarding the specifications of the rotational speed required for an apparatus to blow off waterdrops in the second group, i.e. those of 0.7 microns in diameter, based on the principle of the existing substrate rotating type drying apparatus, a rotational speed not less than about 40,000 rpm is required, i.e, above point A in FIG. 10. To blow off waterdrops mainly by fluid force, a rotational speed of not less than about 12,000 rpm is required.

When substrates to be treated are rotated for drying in an existing batch-wise substrate rotating type drying apparatus, if the rotational speed is instantaneously raised to 40,000 rpm or more, the substrates may be damaged. Even in a single-substrate processing type rotary drying apparatus, the peripheral speed of an 12-inch wafer is about 630 m/sec. Therefore, it is difficult to effect the desired drying from the viewpoint of stress. Even when a fluid force is used as the main operating force, the peripheral speed of a 12-inch wafer is about 190 m/sec. Therefore, the wafer is likely to break. Accordingly, it is essential to adopt a substrate cleaning and drying apparatus of the type in which a substrate to be treated is not rotated.

Figure 11A:
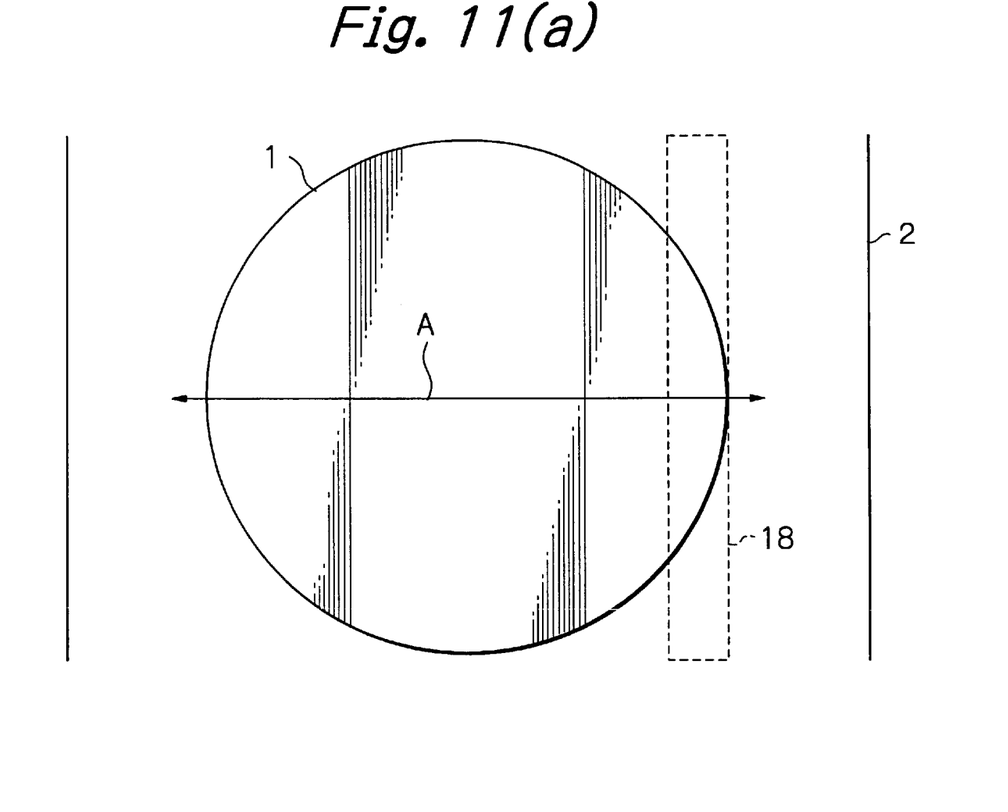
FIG. 11 is a diagram showing a structural example of a substrate treating apparatus for comparison with the substrate treating apparatus according to the present invention.
Figure 11B:
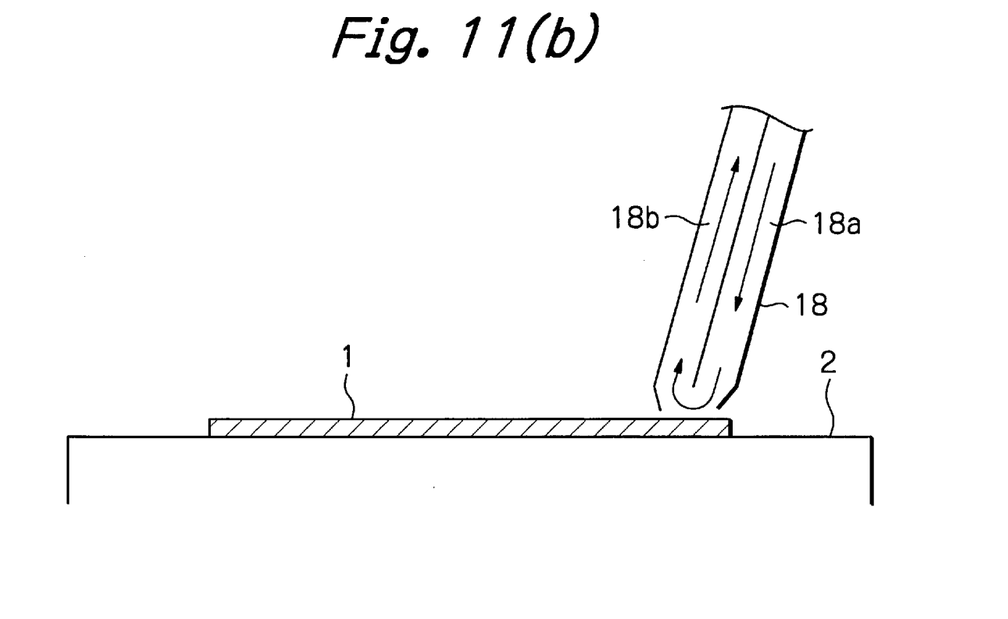

Incidentally, as an apparatus in which a substrate to be treated is dried in a stationary state, an arrangement shown in FIG. 11 is conceivable. A substrate 1 to be treated is held stationary on a slide table 2, and a clean gas is uniformly supplied to the substrate 1 from a flat nozzle 18 to dry the substrate 1. The flat nozzle 18 has a gas supply passage 18a and an exhaust passage 18b therein. A gas is supplied through the gas supply passage 18a and blown on the substrate 1 from the distal end of the gas supply passage 18a. The gas blown on the substrate 1 is immediately sucked from the distal end of the exhaust passage 18b and discharged through the exhaust passage 18b. It should be noted that part (a) of FIG. 11 is a plan view, and part (b) of FIG. 11 is a side view.

The flat nozzle 18 is adapted to move in the diametrical direction of the substrate 1 to be treated, as shown by the arrow A.

When the substrate 1 is dried by using a drying apparatus arranged as stated above, however, a fluid force having a vertical component acts on the surface of the substrate 1. That is, an impactive pressing force acts on the substrate 1. In addition, it is necessary to devise a scheme to prevent adhesion of waterdrops and particles.

In contrast to the described apparatus, in the substrate treating apparatus according to the present invention, there is an extremely low probability that waterdrops or particles will readhere to the substrate 1 because waterdrops and particles are blown off by rotation of the rotary impeller 4 placed to face the substrate 1.

In the drying apparatus arranged as shown in FIG. 11, it is difficult to dry the whole surface of the substrate 1 rapidly. In contrast, the substrate treating apparatus according to the present invention is far superior in achievable process performance although it has in common with the above-described apparatus the feature that a substrate to be treated is dried by blowing a clean gas on the substrate.

Figure 12A:
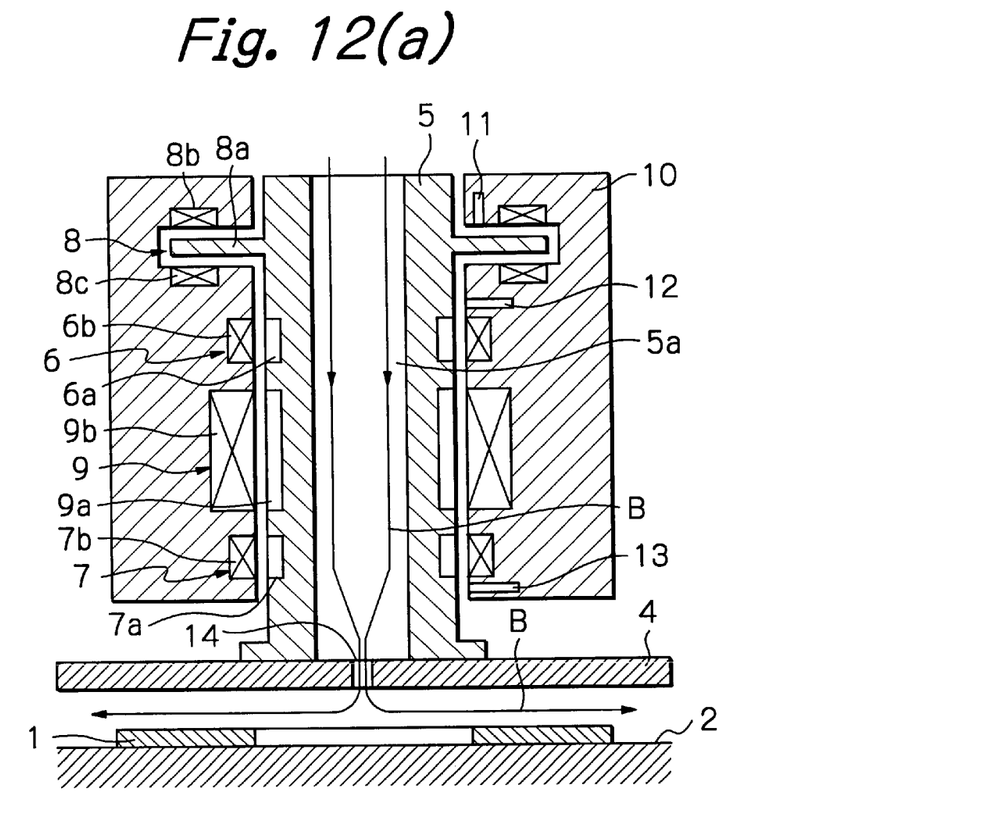
FIG. 12 is a diagram showing a further example of the structure of the substrate treating apparatus according to the present invention.
Figure 12B:
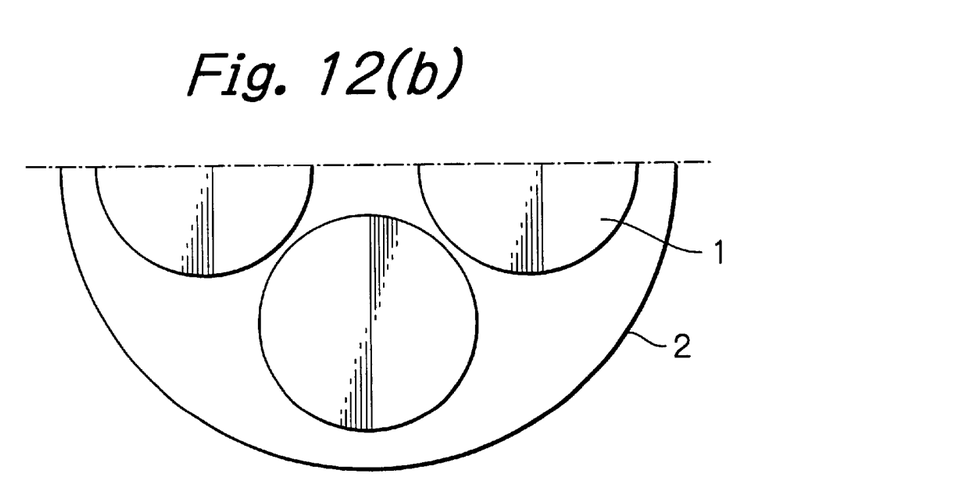

The substrate treating apparatus according to the present invention is not necessarily limited to a single-substrate processing type but may be arranged a plural-substrates processing type as shown in FIG. 12. That is, a plurality of substrates 1 to be treated are loaded on the upper surface of a slide table 2, and a rotary impeller 4 is placed to face the substrates 1. With this arrangement, the apparatus is operated as stated above to carry out cleaning and drying treatments, thereby treating a plurality of substrates 1 simultaneously. In this case also, the apparatus may be arranged as shown in FIG. 9. That is, a pure water supply port 15 and a clean gas supply port 16 are provided in the hollow 5a of the rotating shaft 5, and further a pure water supply nozzle 17 is provided to fill pure water into the gap between the rotary impeller 4 and the substrate 1. With this arrangement, the apparatus is operated by executing the operating method as stated above with respect to the substrate treating apparatus shown in FIG. 9. It should be noted that part (a) of FIG. 12 is a sectional view showing a structural example of the substrate treating apparatus, and part (b) of FIG. 12 is a fragmentary plan view showing a part of the slide table 2.

Figure 13:
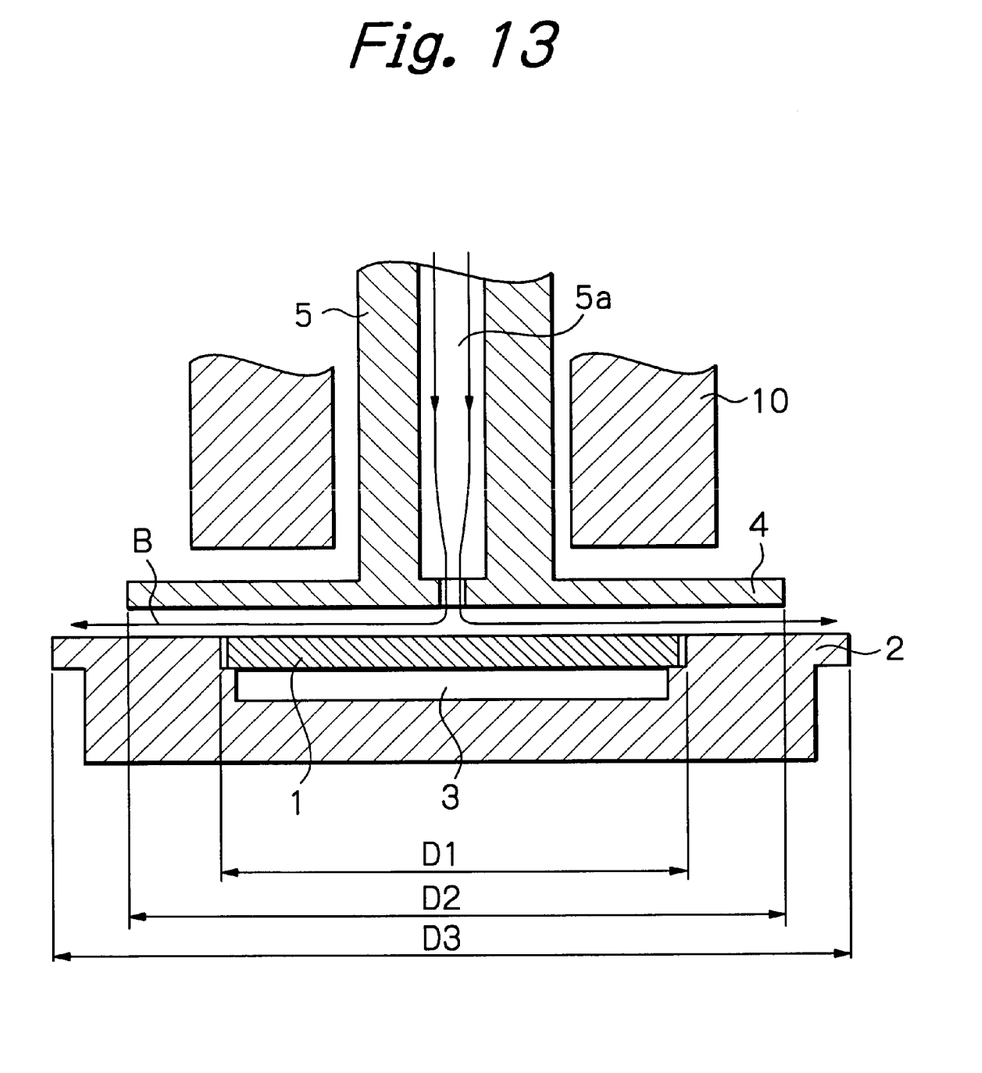
FIG. 13 is a diagram showing a further structural example of the embodiment of the present invention.

FIG. 13 is a further embodiment of the present invention. In this embodiment, the substrate 1 is received in a recess formed in the slide table 2 so that the surface to be treated of the substrate 1 is substantially flush with the upper surface of the slide table 2, and the substrate is held in position by a chuck mechanism (vacuum chuck mechanism) 3. In this embodiment, as shown, the outer diameter D3 of the slide table 2 is greater than the outer diameter D2 of the rotary impeller 4 ($D2 \leq D3$). The surface of the rotary impeller 4 opposing the substrate 1 is flat.

By making the surface to be treated of the substrate 1 substantially flush with the upper surface of the slide table 2 and making the outer diameter of the slide table D3 greater than the outer diameter D2 of the rotary impeller 4 (D2≦D3) as stated above, when the rotary impeller 4 is rotated via the rotary shaft 5, a gas flow generated between the rotary impeller 4 and the slide table 2 (the gas flow shown by the arrow B) is made uniform and, therefore, uniform treatment of the surface of the substrate 1 can be obtained.

Although in the foregoing embodiment the substrate 1 to be treated is expected to be disk-shaped, e.g. a semiconductor wafer, it should be noted that substrates to be dried by the substrate treating apparatus according to the present invention are not necessarily limited to disk-shaped substrates. As a gas to be supplied through the nozzle 14, it is also possible to use an inert gas, e.g. Ar, $N_2$, or He, in addition to dry air. It is also possible to provide a cleaning fluid supply port in the upper part of the hollow section 5a of the rotating shaft 5 to supply a cleaning fluid, e.g. a chemical cleaning fluid, thereby constructing an apparatus that carries out cleaning and drying successively.

As has been stated above, according to the first aspect of the invention, rotating the rotary impeller causes the gas flowing through the nozzle provided in the central portion of the rotary impeller to form a flow of gas flowing along the surface of the substrate supported in a stationary state by the substrate support mechanism. Thus, the gas flows toward the outer periphery of the substrate. Therefore, it is possible to obtain the advantageous effects as stated below.

(1) The surface of the substrate is dried efficiently by the gas flow. Moreover, the rotation of the rotary impeller causes the gas to flow into the gap between the rotary impeller and the substrate through the nozzle. Therefore, no negative pressure is produced at the central portion of the impeller. Accordingly, no waterdrops remain in the central portion of the surface of the substrate, and thus the substrate surface can be dried rapidly.

(2) Because the substrate is held stationary, no stress acts on the substrate. There is also no likelihood of the base material of the substrate being damaged.

According to the second aspect of the invention, either or both of a pure water supply port and a clean gas supply port are provided in the hollow section of the rotating shaft. Therefore, pure water or/and a clean gas can be supplied to the central portion of the substrate through the nozzle. Accordingly, the substrate can be cleaned and dried appropriately.

According to the third aspect of the invention, the rotating shaft of the driving motor is supported in a magnetic levitation manner by a magnetic bearing. Therefore, there is no likelihood that particles will be generated. Thus, the apparatus can be used in a clean environment.

According to the fourth aspect of the invention, the surface of the rotary impeller that faces the substrate is flat. Therefore, although blade efficiency is somewhat reduced, the surface of the rotary impeller that faces the substrate can be brought as close to the substrate as possible, and a gas flow can be produced at a position extremely close to the surface of the substrate. Therefore, the substrate surface can be dried efficiently.

According to the fifth aspect of the invention, the rotary impeller has a flat surface extending from the center thereof to a position slightly outside the outer periphery of the substrate and further has a blade structure outside the flat surface. Accordingly, the gas flows along the surface of the substrate at high flow velocity in such a manner as to be sucked into the blade structure outside the flat surface. Accordingly, the surface of the substrate can be dried more efficiently.

According to the sixth aspect of the invention, after a pure water layer has been formed between the rotary impeller and the substrate, the rotary impeller is rotated. Accordingly, although pure water is scattered outwardly, because pure water is continuously supplied through the nozzle, clean pure water is successively supplied to the substrate surface, and the concentration of a substance eluting out from the substrate into the pure water is maintained at an extremely low value. Then, the rotary impeller is rotated at high speed, and a clean gas is supplied, and at the same time, the supply of pure water is stopped. Consequently, the pure water layer on the substrate surface can be blown off rapidly. As a result, the substrate surface dries rapidly, and the concentration in pure water of a substance eluting out from the substrate is extremely low. Therefore, no water marks occur.

What is claimed is:

1. A substrate treating apparatus comprising:
   a substrate support mechanism for supporting a substrate to be treated in a stationary state;
   a rotary impeller placed to face a surface of said substrate supported by said substrate support mechanism; and
   at least one nozzle provided in an approximately central portion of said rotary impeller;
   wherein rotating said rotary impeller produces a flow of gas passing through said nozzle and flowing from the central portion of said impeller toward an outer periphery thereof, thereby drying the surface of said substrate supported by said substrate support mechanism.

2. A substrate treating apparatus according to claim 1, wherein said rotary impeller is secured to a hollow rotating shaft, said rotating shaft having a hollow section communicating with said nozzle, said hollow section being provided with at least either one of a pure water supply port for supplying pure water therein and a clean gas supply port for supplying a clean gas therein.

3. A substrate treating apparatus according to claim 1, wherein said rotary impeller is connected to a rotating shaft of a driving motor, said rotating shaft of the driving motor being supported by magnetic bearings.

4. A substrate treating apparatus according to claim 2, wherein a surface of said rotary impeller that faces said substrate is a flat surface.

5. A substrate treating apparatus according to claim 1, wherein a surface of said rotary impeller that faces said substrate has radial blades the height thereof is smaller than a gap between said rotary impeller and the surface of said substrate.

6. A substrate treating apparatus according to claim 1, wherein said rotary impeller is formed to have radial grooves on the bottom surface that faces said substrate.

7. A substrate treating apparatus according to claim 1, wherein said rotary impeller has a flat surface extending from a center thereof to a position slightly outside an outer periphery of said substrate and further has a blade structure outside said flat surface.

8. A substrate treating apparatus according to claim 7, wherein said blade structure comprises a plurality of blades or grooves provided on the outer peripheral portion of the bottom surface of said impeller at predetermined intervals.

9. A substrate treating apparatus according to claim 7, wherein said blade structure comprises a plurality of grooves provided on the outer peripheral portion of the top surface of said impeller at predetermined intervals.

10. A substrate treating apparatus according to claim 1, wherein said apparatus is a single-substrate processing type or a plural-substrates processing type.

11. A method of operating a substrate treating apparatus, said substrate treating apparatus including:
- a substrate support mechanism for supporting a substrate to be treated in a stationary state;
- a rotary impeller secured to a hollow rotating shaft and placed to face a surface of said substrate supported by said substrate support mechanism;
- at least one nozzle provided in an approximately central portion of said rotary impeller so as to communicate with a hollow section of said rotating shaft; and
- a pure water supply port for supplying pure water and a clean gas supply port for supplying a clean gas, which are provided in the hollow section of said rotating shaft;

said method comprising the steps of:
- filling pure water into a gap between said rotary impeller and the surface of said substrate to form a pure water layer, and continuously supplying pure water from said pure water supply port through said nozzle to form a flow of pure water on the surface of said substrate that flows from a center of said substrate toward an outer periphery thereof;
- rotating said rotary impeller at a predetermined rotational speed to scatter pure water of said pure water layer outwardly, and continuously supplying pure water to a central portion of said substrate through said nozzle; and
- rotating said rotary impeller at a rotational speed higher than said predetermined rotational speed, and supplying the clean gas from said clean gas supply port through said nozzle while stopping the supply of said pure water, thereby drying the surface of said substrate supported by said substrate support structure.

12. A substrate treating apparatus according to claim 2, wherein said rotary impeller is connected to a rotating shaft of a driving motor, said rotating shaft of the driving motor being supported by magnetic bearings.

13. A substrate treating apparatus according to claim 2, wherein a surface of said rotary impeller that faces said substrate is a flat surface.

14. A substrate treating apparatus according to claim 2, wherein a surface of said rotary impeller that faces said substrate has radial blades the height thereof is smaller than a gap between said rotary impeller and the surface of said substrate.

15. A substrate treating apparatus according to claim 2, wherein said rotary impeller is formed to have radial grooves on the bottom surface that faces said substrate.

16. A substrate treating apparatus according to claim 2, wherein said rotary impeller has a flat surface extending from a center thereof to a position slightly outside an outer periphery of said substrate and further has a blade structure outside said flat surface.

17. A substrate treating apparatus according to claim 16, wherein said blade structure comprises a plurality of blades or grooves provided on the outer peripheral portion of the bottom surface of said impeller at predetermined intervals.

18. A substrate treating apparatus according to claim 16, wherein said blade structure comprises a plurality of grooves provided on the outer peripheral portion of the top surface of said impeller at predetermined intervals.

19. A substrate treating apparatus according to claim 3, wherein a surface of said rotary impeller that faces said substrate is a flat surface.

20. A substrate treating apparatus according to claim 12, wherein a surface of said rotary impeller that faces said substrate is a flat surface.

* * * * *